(12) United States Patent
Johansen et al.

(10) Patent No.: US 8,054,085 B2
(45) Date of Patent: Nov. 8, 2011

(54) PROGRAMMABLE GAIN TRANS-IMPEDANCE AMPLIFIER OVERLOAD RECOVERY CIRCUIT

(75) Inventors: Brian Johansen, Hillsboro, OR (US); Brandon John McCurry, Portland, OR (US)

(73) Assignee: Electro Scientific Industries, Inc., Portland, OR (US)

( * ) Notice: Subject to any disclaimer, the term of this patent is extended or adjusted under 35 U.S.C. 154(b) by 891 days.

(21) Appl. No.: 12/059,752

(22) Filed: Mar. 31, 2008

(65) Prior Publication Data

US 2009/0243636 A1    Oct. 1, 2009

(51) Int. Cl.
    *G01R 31/12*      (2006.01)
    *G01R 31/08*      (2006.01)
    *G01R 27/08*      (2006.01)

(52) U.S. Cl. ............... 324/548; 324/522; 324/713
(58) Field of Classification Search ............ 324/548, 324/522, 713
See application file for complete search history.

(56) References Cited

U.S. PATENT DOCUMENTS

| | | | |
|---|---|---|---|
| 4,862,070 A * | 8/1989 | Ostertag | ............... 324/73.1 |
| 4,931,721 A | 6/1990 | Berrigan et al. | |
| 5,003,486 A | 3/1991 | Hendel et al. | |
| 5,229,653 A | 7/1993 | Lamarche | |
| 5,402,329 A | 3/1995 | Wittenbreder, Jr. | |
| 5,677,634 A | 10/1997 | Cooke et al. | |
| 5,842,579 A | 12/1998 | Garcia et al. | |
| 6,008,630 A | 12/1999 | Prasad | |
| 6,011,403 A * | 1/2000 | Gillette | ............... 324/762.02 |
| 6,697,244 B1 | 2/2004 | Bauer et al. | |
| 6,897,731 B2 | 5/2005 | Zhang et al. | |
| 2002/0196030 A1* | 12/2002 | Kamitani | ............... 324/523 |
| 2005/0218913 A1 | 10/2005 | Inaba et al. | |
| 2007/0177417 A1 | 8/2007 | Corulli et al. | |
| 2008/0290879 A1* | 11/2008 | Newton et al. | ............... 324/548 |

FOREIGN PATENT DOCUMENTS

| | | |
|---|---|---|
| JP | 58-102173 | 6/1983 |
| JP | HEI 9-243693 | 9/1997 |
| JP | HEI 9-243695 | 9/1997 |
| JP | 2002-311074 A | 10/2002 |

* cited by examiner

*Primary Examiner* — Amy He
(74) *Attorney, Agent, or Firm* — Young Basile

(57) ABSTRACT

Embodiments of an apparatus for measuring the leakage current of capacitive components is taught. One embodiment includes a first stage amplifier configured to receive an input from a serially-connected capacitive component at an inverting input and a feedback resistor in a feedback path of the first stage amplifier. A resistance value of the feedback resistor is programmable based on an expected value of the leakage current and a corresponding voltage output.

21 Claims, 4 Drawing Sheets

PROGRAMMABLE GAIN TRANS-IMPEDANCE AMPLIFIER OVERLOAD RECOVERY CIRCUIT

TECHNICAL FIELD

The present invention relates in general to a test for capacitive components.

BACKGROUND

In a known apparatus and method for testing a capacitive component, such as a capacitor, the component is first charged to a desired voltage. Then, the leakage current is measured. An out-of-range value for the leakage current can indicate that the component is faulty.

BRIEF SUMMARY

Embodiments of the invention provide a way to speed up testing of capacitive components, which is particularly desirable in automated, high-volume manufacturing processes. In particular, the invention provides embodiments of an apparatus that quickly recovers from overloads in order to perform the desired test.

The inventive features of certain embodiments are described in more detail below.

BRIEF DESCRIPTION OF THE DRAWINGS

The description herein makes reference to the accompanying drawings wherein like reference numerals refer to like parts throughout the several views, and wherein.

DETAILED DESCRIPTION OF EMBODIMENTS OF THE INVENTION

When testing capacitive components such as multi-layer ceramic capacitors (MLCCs) for leakage current, there exists a large current that the sensing circuitry endures due to the uncharged capacitive component passing some of the charging current to the sense circuitry, where the majority of the passed current is sunk into charging diodes. Ideally, the capacitive component no longer passes current once fully charged. In reality, leakage current passes, and the accurate measurement of this current is an important measure of the quality, specifically the insulation resistance, of the capacitive component.

Conventionally, such testing is performed using circuits including one or more operational amplifiers (op amps) with a respective gain. For an op amp, there is a finite limitation on how large its input signal can be in a given configuration before the op amp goes into saturation. When an op amp is in saturation, the output of the op amp is fixed at its positive or negative supply voltage until the input signal is reduced to a point where the op amp is in its operating range and can provide a correct output signal. How fast the op amp can come out of saturation is a function of several factors, including but not limited to its output current sourcing capability, configuration and loading. When a circuit contains more than one op amp, an overload at the input of the first stage op amp causing the output to saturate could put the following stages into a saturation condition as well.

When testing in data acquisition, and where speed is important, quick recovery from overload conditions is desirable so that accurate data can be obtained at a given time and/or so that the next set of data can be quickly obtained. Accordingly, embodiments of the invention described herein actively drive the measuring circuitry out of such overloads.

Figure 1:
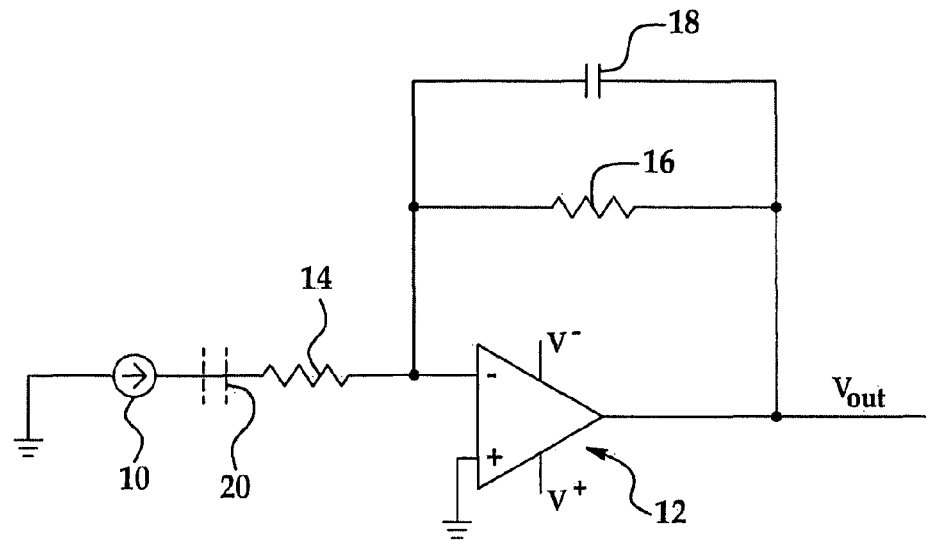
FIG. 1 is a schematic diagram of a trans-impedance amplifier in accordance with one embodiment of the invention.

FIG. 1 shows a trans-impedance amplifier according to one embodiment of the invention. FIG. 1 includes a current source 10 providing a constant current Iin. The current source 10 can be implemented by any number of circuit designs within the knowledge of those in this field given the desired output value. For example, the current source 10 can represent the combination of a voltage source supplying a variable voltage coupled to a programmable current source as described in commonly-assigned U.S. Patent Publication No. 2008/0290879 A1, which is incorporated herein in its entirety by reference.

In FIG. 1, a capacitive component to be tested, hereinafter device under test (DUT) 20, is shown in phantom. As discussed in additional detail hereinafter, a number of such devices are sequentially tested upon connection to the current source 10 and the measuring circuitry including the trans-impedance amplifier.

The DUT 20 is coupled in series to the current source 10, and the current passing therethrough is supplied to the inverting input of an op amp arranged as a current sense amplifier 12 through a resistor 14. The non-inverting input of the current sense amplifier 12 is grounded. Feedback to the inverting input of the current sense amplifier 12 from Vout is provided by a resistor 16 in parallel with a capacitor 18. The value of resistor 16 is Rf.

The transfer function of the current sense amplifier 12 is Vout=−Iin*Rf, which means that for a given input current, the output voltage Vout is the mathematical product of the input current and the resistance value Rf. The ohmic value of Rf is selected based on design requirements. For example, given a measured leakage current is a value between +/−1 mA with full scale representing +/−5V at Vout, a value of Rf of 5 kΩ could be used. Full scale is defined by the designer based on application. Programming of the value of Rf is discussed in more detail hereinafter with respect to FIG. 4.

Figure 2:
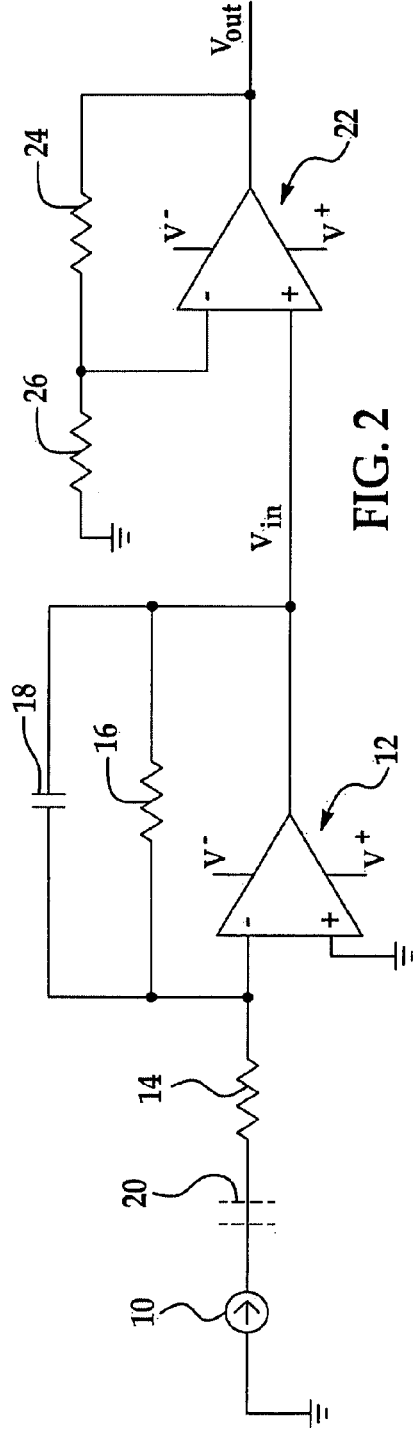
FIG. 2 is a schematic diagram of a trans-impedance amplifier in accordance with another embodiment of the invention.

FIG. 2 includes a trans-impedance amplifier with the current sense amplifier 12 of FIG. 1 as a first stage with the addition of a non-inverting gain stage in the form of an op amp arranged as a non-inverting voltage amplifier 22. One or more additional gain stages, such as that seen in FIG. 2 may be needed when one is trying to monitor low level signals. In turn one could increase the value of Rf in the first amplifier. However, the inventors found that this solution can be problematic if the op amp of the current sense amplifier 12 reached its limits on gain or bandwidth. Also, in some circumstances, keeping the ohmic value of Rf smaller can help with the noise gain of the system. The additional amplifier provided by the second stage non-inverting voltage amplifier allows the application of the same logic to determine ranges and full scale vales as for the first stage described previously.

In FIG. 2, the output of the first stage, voltage Vin, is provided to the non-inverting input of the voltage amplifier 22. Feedback from the output of the voltage amplifier 22 to its inverting input is provided through resistor 24 having a resistance value of R3, and the inverting input is grounded through resistor 26 having a resistance value of R2. The transfer function of this gain stage is Vout=Vin*(1+R3/R2). As described previously, and where the output of the first stage is Vin, the transfer function of the first stage is Vin=−Iin*Rf. Accordingly, with the known current Iin and a desired maximum input voltage Vin and a desired maximum output voltage Vout, one can assign appropriate values for R1, R3 and R2. For example, where the leakage current to be measured is expected to fall between ±1 µA (instead of ±1 mA as in the above example), and full scale represents ±5V, the ohmic value of Rf is equal to 1.25 MΩ where the gain (1+R3/R2) of the second stage is equal to 4.

Although the second stage is shown as a non-inverting voltage amplifier 22, the op amp can instead be arranged as a non-inverting unity gain buffer as described in additional detail hereinafter with respect to FIG. 4. Also, more than one stage of amplification can be included if desired, based on the teachings herein.

Figure 3:
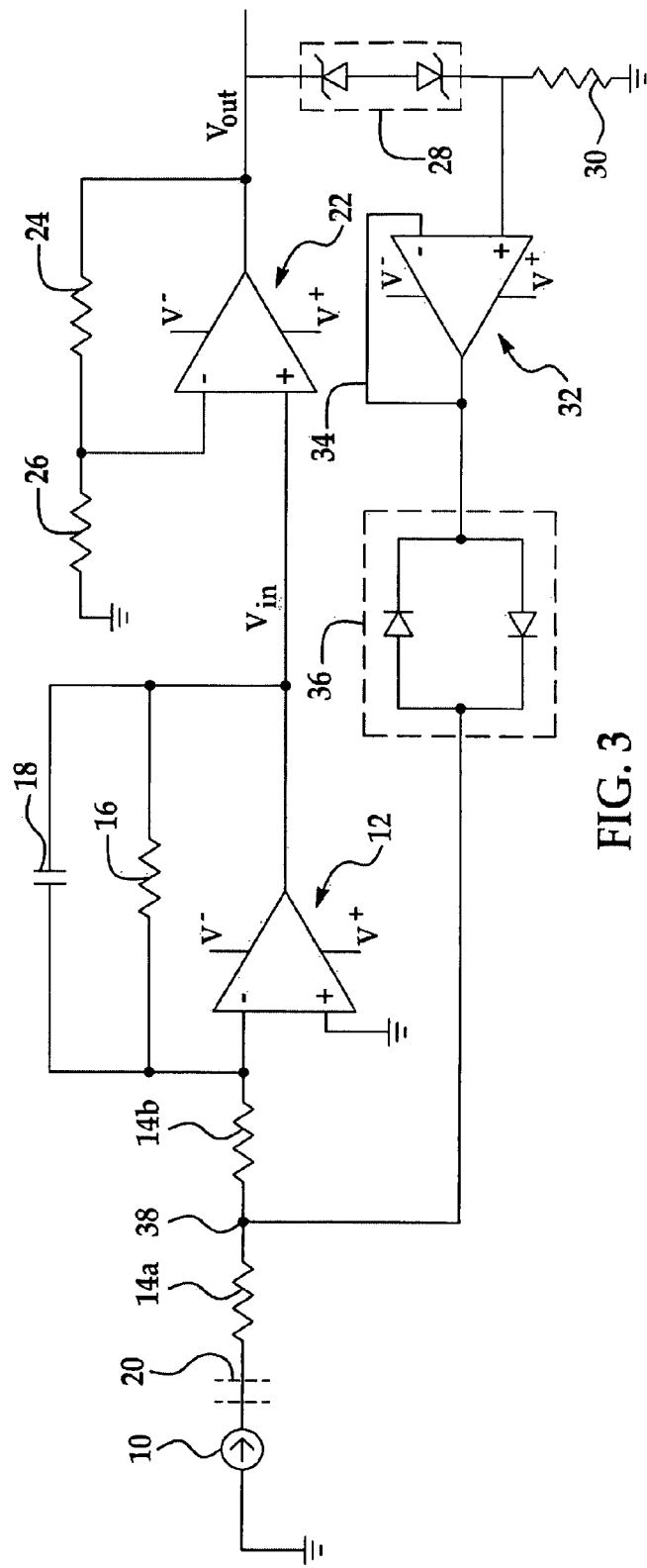
FIG. 3 is a schematic diagram of a trans-impedance amplifier in accordance with yet another embodiment of the invention.

FIG. 3 includes the first and second stages shown in FIG. 2 and adds an additional feedback circuit from the output of the second stage to the inverting input of the first stage. As shown in FIG. 3, the output of the voltage amplifier 22 of the second, non-inverting gain stage is connected to two back-to-back Zener diodes 28. The Zener diodes 28 are connected in series to ground through a resistor 30. An op amp arranged as a non-inverting buffer 32 follows the Zener diodes 28. That is, the Zener diodes 28 are coupled to the non-inverting input of the buffer 32, and a feedback path 34 is provided between the output of the buffer 32 and its inverting input. The output of the buffer 32 is connected to back-to-back signal diodes 36, which are in turn coupled to the inverting input of the current sense amplifier 12 of the first stage. More specifically, resistor 14 of FIGS. 1 and 2 is replaced by resistors 14a and 14b in FIG. 3, and the feedback circuit provided by the back-to-back Zener diodes 28, non-inverting buffer 32 and back-to-back signal diodes 36 is connected to the node 38 between resistors 14a and 14b.

In this circuit, input currents in the desired, expected range allow the circuit to behave in a linear fashion as determined by the transfer functions of the stages as previously discussed. During normal operation, the back-to-back Zener diodes 28 prevent the flow of current to the feedback path because Vout is below the turn on voltage of the Zener diodes. The non-inverting buffer 32 is inactive, and the back-to-back signal diodes 36 prevent the flow of current from the node 38 to the output of the non-inverting buffer 32. However, where the input currents into the circuit (that is, the input currents into the inverting input of the first stage current sense amplifier 12) are out of range and large enough to drive the output of the amplifier to either of its rails, the voltage output Vout from the voltage amplifier 22 begins to move towards its power supply rails. Once large enough to turn on the Zener diodes 28, Vout will be at the clamping voltage of the Zener diodes 28. Then, the clamping voltage is provided to the non-inverting buffer 32, which is desirably selected for a high-current drive capacity. The current from the output of buffer 32 is supplied to the signal diodes which begin to conduct after enough current from buffer 32 is supplied to them, which in turn actively drives the potential at node 38 lower. As this potential lowers, the input signal seen by the current sense amplifier 12 reduces to allow the amplifier to start recovery from the overload at its input.

Although FIG. 3 illustrates a feedback circuit from the output of the second stage to the inverting input of the first stage, the feedback circuit of FIG. 3 could implemented with a single stage as taught in FIG. 1. This is generally less desirably at least for stability reasons, but it is possible. Also, the configuration of FIG. 3 could be implemented with the non-inverting amplifier 22 of FIG. 2 being replaced with a buffer as described with respect to FIG. 4.

Figure 4:
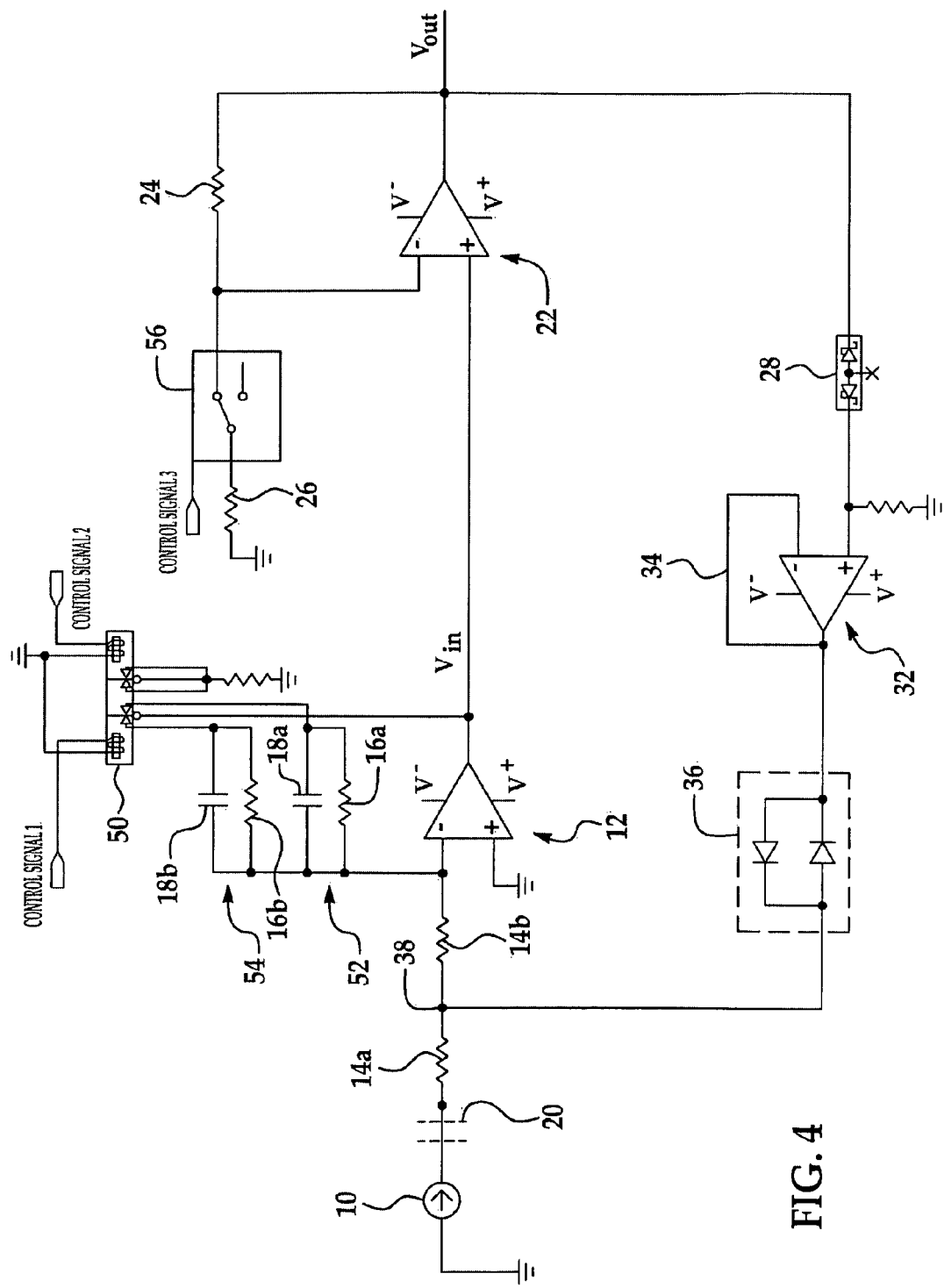
FIG. 4 is a schematic diagram of a trans-impedance amplifier in accordance with FIG. 3 illustrating a programmable gain of each stage.

The gains in the circuit topology can be programmable as shown in FIG. 4. In FIG. 4, the gain of both the first stage and the second stage are programmable depending on the application. In addition to the configuration shown in FIG. 3, FIG. 4 includes a field-programmable gate array (FPGA) 50 coupled to two feedback circuits for the current sense amplifier 12. More specifically, a first feedback circuit 52 includes resistor 16a and capacitor 18a arranged in parallel, and a second feedback circuit 54 includes resistor 16b and capacitor 18b arranged in parallel. The value of either 16a or 16b is Rf, as previously described with respect to resistor 16. More than two feedback circuits are possible. The FPGA 50 is programmed to switch in, that is, enable either the first or second feedback circuit 52, 54 depending on Control Signals 1 and 2. Similarly, optional control is provided for a switch 56 coupled to the resistor 26 of the non-inverting voltage amplifier 22. Through the application of Control Signal 3 to switch 56, the resistor 26 (with value R2) can be switched in and out of the circuitry. As those skilled in the art will recognize from this description, omitting resistor 26 would change the configuration of the op amp from that of the non-inverting voltage amplifier 22 to a non-inverting unity gain buffer. This configuration is useful when the output signal Vin does not need to be amplified. As in the discussion of FIG. 3, the second stage can be omitted in its entirety if desired.

Control signals 1, 2 and 3 in this embodiment are provided by a microcomputer including a random access memory (RAM), a read-only memory (ROM), keep alive memory (KAM), a central processing unit (CPU), etc., in addition to various input and output connections. In the application described below with respect to FIG. 5, for example, the microcomputer operates a software program to perform the described testing, including the presentation of a set up menu by the user including information such as the expected leakage current, which depends on the size of the capacitive component, and the corresponding full scale voltage. Responsive to this menu, the microcomputer can program the gain through the Control Signals 1, 2 and 3 provided to the FPGA 50 and switch 56. Of course, the functions of the FPGA 50 could be implemented by one or more hardware components. Any number of solid-state switches could be used to implement the switch 56.

Having programmable gains in the circuit topology allows any meter containing the circuitry to have a large dynamic range. For example, the measurement capability could range from leakage current values from between ±1 mA with resolution down to ±200 pA. This task is difficult to accomplish using only fixed values of Rf, R3 and R2 when such precision measurements are needed. Subdividing this range into a plurality of regions makes the task easier for the hardware involved. Within these ranges, ohmic values for Rf, R3 and R2 can be assigned by defining a full scale voltage for each range and gain values for the second stage as described above. When a large dynamic range is needed for the instrument, the ohmic value of Rf of current sense amplifier 12 and the gain of amplifier 22 are desirably programmed. Then, independent of range, if the input current to the circuit is large enough to cause an overload at current sense amplifier 12, driving the output of amplifier 22 towards the Zener diode 28 turn on voltage. Once that voltage is reached, the feedback network activates, assisting the circuit to return to its linear range much faster than amplifier 12 or 22 could do by themselves and turning off once the product of the output voltage of current sense amplifier 12 and the gain of amplifier 22 is below the Zener diode turn on voltage. The circuit is back in its linear range.

As mentioned, when a range of leakage current values is expected, subdividing the ranges and controlling the programmable gain based on each range is desirable. The following table provides values for four different ranges of leakage currents as an example of the application of the programmable gain teachings of the invention.

| Leakage current range (+/−) | Value Rf (kΩ) | Gain of second stage |
|---|---|---|
| 3 μA | 324 | 4 |
| 12 μA | 324 | 1 |
| 50 μA | 20 | 4 |
| 200 μA | 20 | 1 |

These ranges can be implemented in the embodiment of FIG. 4 by associating the value Rf of 324 kΩ with resistor 16a and associating the value Rf of 20 kΩ with resistor 16b. These values could then be selectively switched by the FPGA 50. The resistance values of resistors 24 and 26 would be set such that the gain is 4, for example, the value R3 could be 3 kΩ, while the value of R2 could be 1 kΩ. The gain of amplifier 22 could then be selectively switched by switch 56 to change the gain between 1 and 4 depending on the desired range.

The circuitry according to any of FIGS. 1-4 can be implemented as part of a stand-alone test device in any number of applications for testing capacitive components. The trans-impedance amplifier can also be implemented in a separate device from the current source. Then, the current source can be any programmable computer-controlled source, such as models of the 54XX power supply available from Electro Scientific Industries, Inc. of Portland, Oreg., the assignee of the present patent application. One particularly desirable use of the trans-impedance amplifier is in electronic component handlers that test a high volume of electronic components in a relatively short period of time. These handlers include but are not limited to products sold by Electro Scientific Industries, Inc., which sells a variety of electronic component handlers including but not limited to a high volume MLCC tester sold as the Model 3500.

Figure 5:
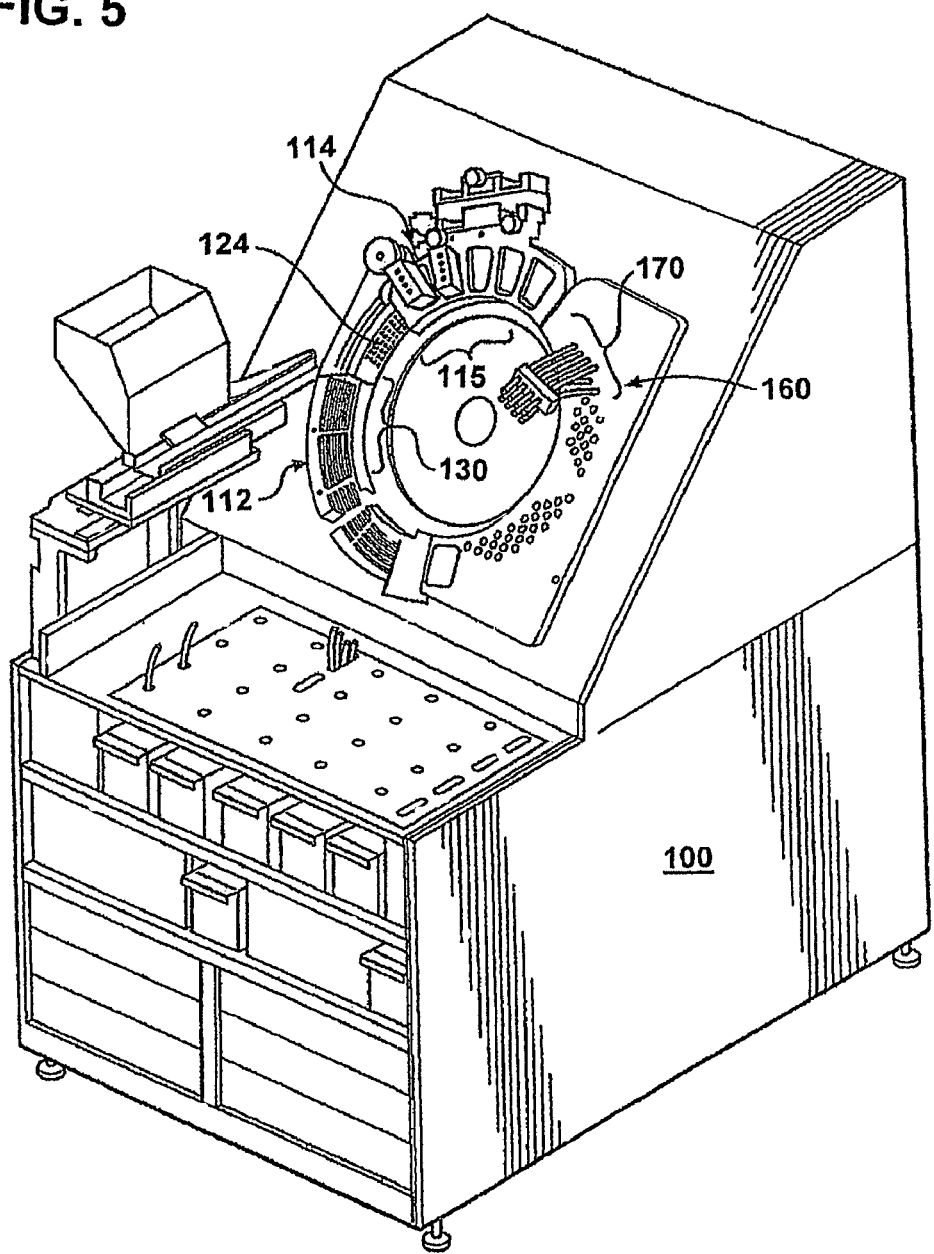
FIG. 5 is plan view of an electronic component handling machine with which embodiments of the invention can be used.

One electronic component handling machine is illustrated in commonly-assigned U.S. Pat. No. 5,842,579 entitled Electrical Circuit Component Handler, which is incorporated herein in its entirety by reference. FIG. 5 shows an overall pictorial view of the electrical circuit component handler 100. The handler 100 has a loading frame 112 defining a loading zone 130, a plurality of test modules 114 defining a test zone 115 and a blow-off 160 defining a blow off zone 170. In operation, electronic components are passed through loading frame 112 in loading zone 130 to be individually drawn into test seats 124 found on a test plate (not shown in its entirety) with the assistance of a vacuum. After testing a component in the test zone 115, the component moves to the blow off zone 170, where the blow-off 160 removes the vacuum and sorts the part based on the results of the test(s).

Although not shown in detail, an embodiment of the invention and the current source 10, if separately implemented, would be electrically coupled to the test modules 114 for testing each component in the test zone 115. Namely, the components in the test seats 124 are subjected to a number of tests in the test zone 115 through the use of the test modules 114. For example, when MLCCs are tested, data is generally provided on, for example, the capacitance, dissipation factor and insulation resistance. The data obtained from testing can then be used to sort the parts by tolerance and find those parts that are defective.

As explained briefly above, in operation, when an uncharged capacitor enters for testing, here being placed in a test seat 124, a charge current and charge voltage are applied to this DUT 20 to sequentially perform tests in sequence according to individual manufacturer requirements. With respect to the insulation resistance (IR) test, the application of the charge current from current source 10 to the DUT 20 results in a large current, producing an overload in the trans-impedance amplifier, starting with an overload of the current sense amplifier 10. As the DUT 20 charges, the current seen at the inverting input of the current sense amplifier 12 begins to lower. After a short time, the input to the current sense amplifier 12 is the leakage current. The measured leakage current represents the insulation resistance of the DUT 20. The recovery time for the current sense amplifier 12 and, where applicable, the voltage amplifier 22, is minimized by appropriate gain selection for each stage and the feedback circuit of FIG. 3 when used. A small recovery time is especially important when the DUT 20 is a large value capacitor, where the leakage current is relatively high. If the measurement is taken before recovery is completed, that is, before the end of the overload(s), the measurement may capture the response of the measurement circuitry recovery and not the actual leakage current. In high-speed testing, this is more of a risk.

The problems of initial overload and the resulting recovery time can also be complicated by other tests that may be performed before the insulation resistance (IR) test. One such test is a contact check test. The contact check test is used to verify that the part to be tested, such as DUT 20, has properly arrived at the test station. According to one known implementation, a 1 volt peak-to-peak, high frequency sine wave is generated through the DUT 20, and the resultant AC current is measured and compared to a predetermined threshold that indicates the presence of the DUT 20. Sense circuitry separate from the trans-impedance amplifier according to embodiments of the present invention perform this measurement from a common entry point. This application of the charge voltage can cause the circuitry of any of FIGS. 1-3 to overload. Depending on how much soak time is allowed before the IR measurement is taken, fast recovery of the current sense amplifier 12 and the voltage amplifier 22 may be needed due to this earlier test.

Figure 6:
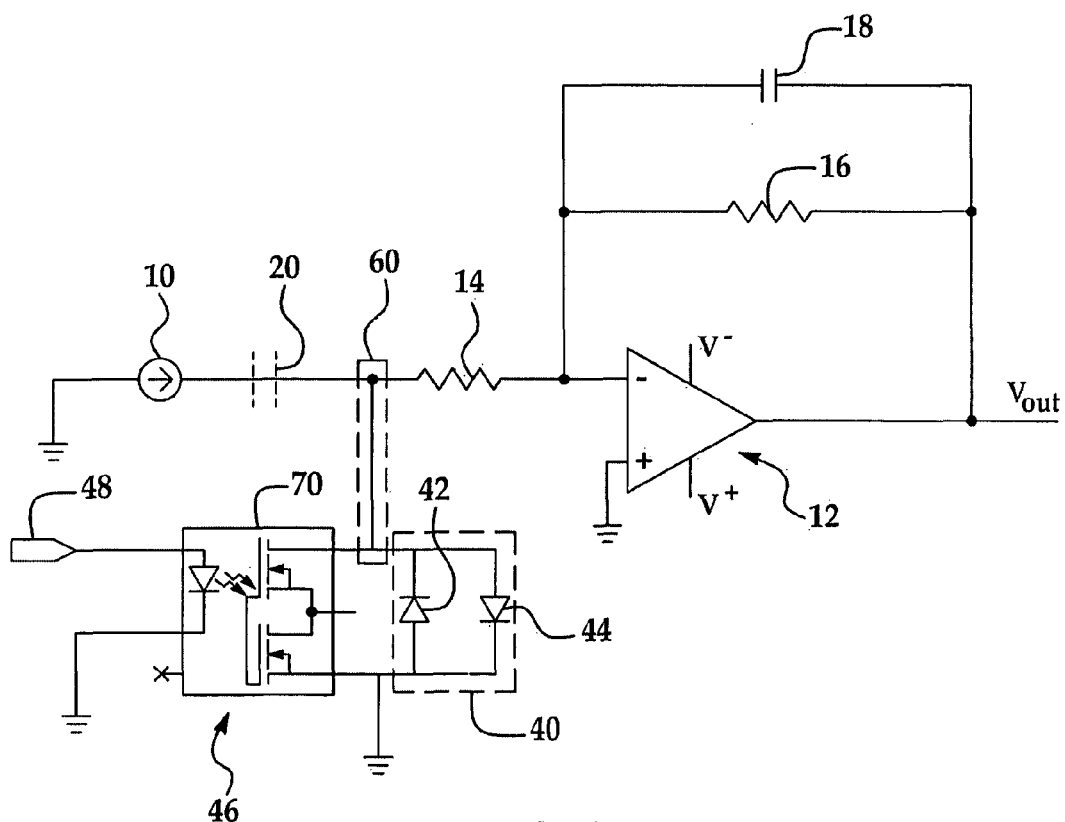
FIG. 6 is a schematic diagram of a fast recovery current sink incorporated with the trans-impedance amplifier according to FIG. 1.

As can be seen, the circuitry described in the present application provides an alternative solution to similar problems described in U.S. Patent Publication No. 2008/0290879 A1. However, the inventive concepts taught therein can be incorporated with the teachings of the present invention to obtain additional benefits. FIG. 6 illustrates the optional addition to the measurement circuitry of FIG. 1 of a fast recovery current sink 46 in accordance with the teachings of U.S. Patent Publication No. 2008/0290879 A1.

In FIG. 6, the fast recovery current sink 46 is connected at a tap 60 between the DUT 20 and resistor 14 and is grounded. A diode clamp 40 is provided by two diodes 42, 44 arranged in parallel such that the anode of the first diode 42 and the cathode of the second diode 44 are grounded and the cathode of the first diode 42 and the anode of the second diode 44 are electrically coupled to the tap 60. The clamp diodes 42, 44 provide a current return path for the charge current of the DUT 20. In addition, the clamp diodes 42, 44 provide input protection for the current sense amplifier 12 if the DUT 20 short circuits by clamping the voltage of the current source 10. Note that the clamp diodes 42, 44 can be similarly incorporated in each embodiment of the invention, although they are not shown in FIGS. 1-4 to simplify the description of the trans-impedance amplifier.

The switch 70 of U.S. Patent Publication No. 2008/0290879 A1 that is connected in parallel across the diode clamp 40 is implemented here by a solid-state relay, by example only a PVG612 power MOSFET photovoltaic relay available from International Rectifier of El Segundo, Calif. A control signal 48 from a controller closes the switch 70 while the DUT 20 is being charged by the current source 10. Then, the switch 70 is opened before the leakage current is measured by the trans-impedance amplifier.

Using the teachings of the present invention, the need to coordinate timing between switches enabling and disabling the charging circuitry (including the sink 46) and the measurement circuitry described in U.S. Patent Publication No. 2008/0290879 A1 is eliminated. As the current sink 46 is switched open before leakage current is measured, a change in the potential of the current sense amplifier 12 results. Accordingly, there is a resulting change at the output of the current sense amplifier 12 and the voltage amplifier 22, where used. The overload recovery components of the trans-impedance amplifier taught herein then assist in reducing any voltage disturbance, allowing the leakage current measurement to be taken quickly after the current sink 46 is switched.

The combination of these teachings is particularly useful when testing high value capacitors. This is because when the current sink 46 is switched out, there is an immediate change in the magnitude of the input to the current sense amplifier 12 due to the high-impedance of the entire trans-impedance amplifier. This magnitude depends on the input impedance value Rin of the trans-impedance amplifier and the value Rf of the current sense amplifier 12. The voltage gain of the trans-impedance amplifier follows the transfer function Vout=−Rf/Rin. If the value Rf is as large as is needed for nano-amp and pico-amp measurements, an initial overload to the current sense amplifier 12 is likely. Due to the overload recovery of the trans-impedance amplifier, the overload quickly resolves.

Although FIG. 6 shows the fast recovery current sink 46 coupled to the trans-impedance amplifier of FIG. 1, the fast recovery current sink 46 can be incorporated into any of the embodiments thereof, including those shown and described with respect to FIGS. 2-4.

Capacitive component leakage current measurements in production environments require both accuracy and speed. Embodiments of a trans-impedance amplifier with overload recovery allow for a quick reduction in any initial overload in the front end circuitry, thus limiting the delay in the measurement of the leakage current past the time the capacitive component being tested is fully charged. Moreover, implementing an embodiment of the trans-impedance amplifier reduces the risk that the measurement so taken will reflect its recovery instead of the actual leakage current.

The above-described embodiments have been described in order to allow easy understanding of the present invention, and do not limit the present invention. On the contrary, the invention is intended to cover various modifications and equivalent arrangements included within the spirit and scope of the appended claims, which scope is to be accorded the broadest interpretation so as to encompass all such modifications and equivalent structures as is permitted under the law.

What is claimed is:

1. In an apparatus for measuring a leakage current of a capacitive component including at least one operational amplifier, the improvement comprising:
    a first stage amplifier configured to receive an input from a serially-connected capacitive component at an inverting input, a non-inverting input of the first stage amplifier coupled to ground; and
    a feedback path of the first stage amplifier, a resistance value of the feedback path dependent on an expected value of the leakage current and a corresponding full scale voltage of the first stage amplifier.

2. The improvement according to claim 1 wherein the resistance value of the feedback path is programmable, the improvement further comprising:
    means for programming the resistance value to one of a plurality of values.

3. The improvement according to claim 1, further comprising:
    a second stage amplifier coupled to an output of the first stage amplifier.

4. The improvement according to claim 3 wherein the output of the first stage amplifier is coupled to a non-inverting input of the second stage amplifier.

5. The improvement according to claim 4 wherein the second stage amplifier includes a programmable gain, the improvement further comprising:
    a switch configured to switch the programmable gain from unity gain to a value greater than unity gain.

6. The improvement according to claim 5, further comprising:
    a feedback path from an output of the second stage amplifier to a summing junction at the inverting input of the first stage amplifier.

7. The improvement according to claim 6 wherein the feedback path from the output of the second stage amplifier to the summing junction at the inverting input of the first stage amplifier comprises:
    means for preventing a flow of current from an output of the second stage amplifier to the summing junction at the inverting input of the first stage amplifier until the output of the second stage exceeds a defined range of values; and
    means for limiting a flow of current in a direction from the summing junction to the output of the second stage amplifier.

8. The improvement according to claim 7 wherein the defined range includes values greater than the saturation voltage of the second stage amplifier.

9. The improvement according to claim 6 wherein the feedback path comprises:
    back-to-back Zener diodes coupled to the output of the second stage amplifier;
    a buffer amplifier including a non-inverting input coupled to the back-to-back Zener diodes; and
    back-to-back signal diodes coupled to an output of the buffer amplifier and to the summing junction of the inverting input of the first stage amplifier.

10. The improvement according to claim 1, further comprising:
    a second feedback path from an output of the first stage amplifier to the inverting input of the first stage amplifier, the second feedback path configured to reduce an input to the inverting input when an output value of the first stage amplifier indicates saturation of the first stage amplifier.

11. The improvement of claim 1, further comprising:
an input resistor coupled to the inverting input of the first stage amplifier and configured to receive the input from the serially-connected capacitive component.

12. In an apparatus for measuring a leakage current of a capacitive component including at least one operational amplifier, the improvement comprising:
a first stage amplifier configured to receive an input from a serially-connected capacitive component at an inverting input;
a feedback resistor in a feedback path of the first stage amplifier, a resistance value of the feedback resistor dependent on an expected value of the leakage current and a corresponding full scale voltage of the first stage amplifier; and
a second stage amplifier coupled to an output of the first stage amplifier, the second stage amplifier including a programmable gain.

13. The improvement according to claim 12, further comprising:
means for switching the programmable gain from unity gain to a value greater than unity gain.

14. An apparatus for measuring a leakage current of a capacitive component, the apparatus comprising:
a first stage amplifier configured to receive an input from a serially-connected capacitive component at an inverting input;
a programmable feedback resistor in a feedback path of the first stage amplifier, a resistance value of the programmable feedback resistor dependent on an expected value of the leakage current and a corresponding full scale voltage of the first stage amplifier;
a second stage amplifier coupled to an output of the first stage amplifier; and
a feedback path from an output of the second stage amplifier to the inverting input of the first stage amplifier, the feedback path configured to reduce an input to the inverting input when an output value of the second stage amplifier indicates saturation of the second stage amplifier.

15. The apparatus according to claim 14, further comprising:
a programmable device configured to switch the programmable feedback resistor from a first value to a second value dependent on the expected value of the leakage current and the corresponding full scale voltage of the first stage amplifier.

16. The apparatus according to claim 15 wherein the second stage amplifier includes a programmable gain, the apparatus further comprising:
a switch configured to switch the programmable gain of the second stage amplifier from unity gain to a value greater than unity gain.

17. The apparatus according to claim 14 wherein the second stage amplifier includes a programmable gain, the apparatus further comprising:
a switch configured to switch the programmable gain of the second stage amplifier from unity gain to a value greater than unity gain.

18. The apparatus according to claim 14 wherein the feedback path from the output of the second stage amplifier to the inverting input of the first stage amplifier comprises:
means for preventing a flow of current from the output of the second stage amplifier to the inverting input of the first stage amplifier until the output value of the second stage amplifier indicates saturation of the second stage amplifier; and
means for limiting a flow of current in a direction from the inverting input of the first stage amplifier to the output of the second stage amplifier.

19. The apparatus according to claim 14 wherein the feedback path from the output of the second stage amplifier to the inverting input of the first stage amplifier comprises:
back-to-back Zener diodes coupled to the output of the second stage amplifier;
a buffer amplifier including a non-inverting input coupled to the back-to-back Zener diodes; and
back-to-back signal diodes coupled to an output of the buffer amplifier and to the inverting input of the first stage amplifier.

20. The apparatus according to claim 14, further comprising:
a diode clamp coupled to the inverting input of the first stage amplifier.

21. The apparatus according to claim 14, further comprising:
a current source coupled to the serially-connected capacitive component.

* * * * *